(12) United States Patent
Jeon et al.

(10) Patent No.: US 10,608,031 B2
(45) Date of Patent: Mar. 31, 2020

(54) IMAGE SENSOR

(71) Applicant: Samsung Electronics Co., Ltd., Suwon-si, Gyeonggi-do (KR)

(72) Inventors: Kyung Ah Jeon, Hwaseong-si (KR); Bongje Lee, Cheongju-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/422,953

(22) Filed: May 24, 2019

(65) Prior Publication Data
US 2019/0280034 A1 Sep. 12, 2019

Related U.S. Application Data

(63) Continuation of application No. 15/813,066, filed on Nov. 14, 2017, now Pat. No. 10,411,057.

(30) Foreign Application Priority Data

Dec. 20, 2016 (KR) .......................... 10-2016-0174837

(51) Int. Cl.
*H01L 27/146* (2006.01)
*H04N 5/3745* (2011.01)
(Continued)

(52) U.S. Cl.
CPC .... *H01L 27/14629* (2013.01); *H01L 27/1463* (2013.01); *H01L 27/1464* (2013.01); *H01L 27/14621* (2013.01); *H01L 27/14627* (2013.01); *H01L 27/14636* (2013.01); *H01L 27/14641* (2013.01); *H01L 27/14645* (2013.01); *H04N 5/37457* (2013.01); *H04N 5/33* (2013.01); *H04N 5/378* (2013.01); *H04N 9/045* (2013.01); *H04N 2209/042* (2013.01)

(58) Field of Classification Search
CPC ........... H01L 27/14627; H01L 27/1464; H01L 27/14629; H01L 31/0232; H01L 2224/02331; H01L 27/14267; H01L 27/1463; H01L 27/14636; H01L 27/14641; H04N 5/378; H04N 5/37457
See application file for complete search history.

(56) References Cited

U.S. PATENT DOCUMENTS 8,119,439 B2  2/2012  Park
8,629,523 B2  1/2014  Shih et al.
(Continued)

*Primary Examiner* — Caridad Everhart
(74) *Attorney, Agent, or Firm* — Renaissance IP Law Group LLP

(57) ABSTRACT

A substrate has a first surface and a second surface facing each other. A photoelectric conversion region includes a plurality of photoelectric conversion devices provided in the substrate. An interlayered insulating layer is provided on the first surface of the substrate. A plurality of wires is provided on the interlayered insulating layer. An inter-wire insulating layer covers the plurality of wires. A plurality of micro lenses is provided on the second surface of the substrate. A grid pattern is provided in at least one of the interlayered insulating layer and the inter-wire insulating layer. The grid pattern, when viewed in a plan view, overlaps a region between two adjacent photoelectric conversion devices of the plurality of photoelectric conversion devices.

20 Claims, 12 Drawing Sheets

(51) Int. Cl.
*H04N 5/33* (2006.01)
*H04N 5/378* (2011.01)
*H04N 9/04* (2006.01)

(56) References Cited

U.S. PATENT DOCUMENTS

| | | |
|---|---|---|
| 9,041,071 B2 | 5/2015 | Ahn |
| 9,343,495 B2 | 5/2016 | Minami et al. |
| 9,349,770 B2 | 5/2016 | Lenchenkov |
| 9,437,635 B2 | 9/2016 | Soda |
| 2006/0115230 A1* | 6/2006 | Komoguchi ...... H01L 27/14601 385/146 |
| 2006/0255280 A1* | 11/2006 | Shibayama ....... H01L 27/14603 250/370.11 |
| 2008/0283728 A1 | 11/2008 | Inoue |
| 2010/0144084 A1 | 6/2010 | Doan et al. |
| 2010/0203665 A1 | 8/2010 | Park |
| 2011/0254115 A1 | 10/2011 | Shih et al. |
| 2012/0242874 A1 | 9/2012 | Noudo et al. |
| 2013/0221410 A1 | 8/2013 | Ahn |
| 2013/0234202 A1 | 9/2013 | Jangjian et al. |
| 2015/0028405 A1 | 1/2015 | Minami et al. |
| 2015/0145089 A1 | 5/2015 | Soda |
| 2015/0228689 A1 | 8/2015 | Lenchenkov |
| 2016/0043125 A1 | 2/2016 | Hatano |
| 2016/0204147 A1 | 7/2016 | Hagita |
| 2016/0247841 A1* | 8/2016 | Cheng .................. H01L 31/036 |

* cited by examiner

IMAGE SENSOR

CROSS-REFERENCE TO RELATED APPLICATION

This application is a continuation of U.S. patent application Ser. No. 15/813,066, filed on Nov. 14, 2017, which claims priority under 35 U.S.C. § 119 to Korean Patent Application No. 10-2016-0174837, filed on Dec. 20, 2016, in the Korean Intellectual Property Office, the disclosure of which is incorporated by reference herein in its entirety.

TECHNICAL FIELD

The present inventive concept relates to an image sensor.

DISCUSSION OF RELATED ART

Image sensors convert incoming light into electrical signals used to generate an image. With the development of the computer and communications industries, there is an increased demand for high performance image sensors in a variety of applications such as digital cameras, camcorders, personal communication systems, gaming machines, security cameras, micro-cameras for medical applications, and robots.

SUMMARY

According to an exemplary embodiment of the present inventive concept, an image sensor is provided as follows. A substrate has a first surface and a second surface facing each other. A photoelectric conversion region includes a plurality of photoelectric conversion devices provided in the substrate. An interlayered insulating layer is provided on the first surface of the substrate. A plurality of wires is provided on the interlayered insulating layer. An inter-wire insulating layer covers the plurality of wires. A plurality of micro lenses is provided on the second surface of the substrate. A grid pattern is provided in at least one of the interlayered insulating layer and the inter-wire insulating layer. The grid pattern, when viewed in a plan view, overlaps a region between two adjacent photoelectric conversion devices of the plurality of photoelectric conversion devices.

According to an exemplary embodiment of the present inventive concept, the grid pattern includes a first grid pattern provided in the interlayered insulating layer.

According to an exemplary embodiment of the present inventive concept, the first grid pattern is provided to penetrate the interlayered insulating layer.

According to an exemplary embodiment of the present inventive concept, an ion injection region is provided in the substrate and adjacent to the first grid pattern.

According to an exemplary embodiment of the present inventive concept, a ground voltage is applied to at least one of the plurality of wires, and the at least one of the plurality of wires is connected to the first grid pattern.

According to an exemplary embodiment of the present inventive concept, the image sensor further includes a transfer gate electrode provided in the interlayered insulating layer and on the first surface of the substrate. When measured vertically from the first surface, a bottom surface of the first grid pattern is higher than a top surface of the transfer gate electrode.

According to an exemplary embodiment of the present inventive concept, the image sensor further includes an etch stop layer provided on the transfer gate electrode and the first surface. When measured vertically from the first surface, the bottom surface of the grid pattern is higher than a topmost surface of the etch stop layer.

According to an exemplary embodiment of the present inventive concept, the grid pattern includes a first grid pattern provided in the interlayered insulating layer and a second grid pattern provided in the inter-wire insulating layer. The first and second grid patterns, when viewed in a plan view, overlap each other.

According to an exemplary embodiment of the present inventive concept, the image sensor further includes a plurality of color filters each provided between the second surface of the substrate and one of the plurality of micro lenses.

According to an exemplary embodiment of the present inventive concept, the image sensor further includes a read circuit region and a doped isolation layer provided in the substrate. The doped isolation layer surrounds the photoelectric conversion region. A part of the doped isolation layer is disposed between the photoelectric conversion region and the read circuit region. The grid pattern overlaps the doped isolation layer and has a width smaller than a width of the doped isolation layer, when viewed in a plan view.

According to an exemplary embodiment of the present inventive concept, the image sensor further includes a device isolation layer vertically penetrating the substrate from the first surface to the second surface and surrounding the photoelectric conversion region. The grid pattern overlaps the device isolation layer and has a width smaller than a width of the device isolation layer, when viewed in a plan view.

According to an exemplary embodiment of the present inventive concept, an image sensor is provided as follows. A semiconductor substrate has a first conductivity type. A plurality of photoelectric conversion devices has a second conductivity type and is disposed in the semiconductor substrate. A plurality of gate electrodes is disposed on a surface of the semiconductor substrate. Each of the plurality of gate electrodes is disposed on one of the plurality of photoelectric conversion devices. A grid pattern includes a plurality of rectangular patterns, each of the plurality of rectangular patterns enclosing one of the plurality of photoelectric conversion devices. Each of the plurality of rectangular patterns includes a first end portion and a second end portion being separated from each other to the extent that one of the plurality of gate electrodes is disposed between the first end portion and the second end portion of each of the plurality of rectangular patterns.

According to an exemplary embodiment of the present inventive concept, an image sensor further includes a plurality of common floating diffusion regions. A predetermined number of photoelectric conversion devices of the plurality of photoelectric conversion devices constitutes a unit pixel region sharing one of the plurality of common floating diffusion regions. The predetermined number of photoelectric conversion devices may include two, or more.

According to an exemplary embodiment of the present inventive concept, an image sensor further includes an interlayered insulating layer provided on the semiconductor substrate, and a plurality of contact plugs, each of the plurality of contact plugs penetrating the interlayered insulating layer to be in direct contact with one of the plurality of gate electrodes. The grid pattern comprises a first grid pattern provided in the interlayered insulating layer.

According to an exemplary embodiment of the present inventive concept, an image sensor further includes a plurality of first wires provided on the interlayered insulating layer, an inter-wire insulating layer covering the plurality of first wires, and a plurality of second wires provided on the inter-wire insulating layer. The grid pattern further includes a second grid pattern provided in the inter-wire insulating layer. A top surface of the first grid pattern is closer to the surface of the semiconductor substrate than a bottom surface of each of the plurality of first wires. A top surface of the second grid pattern is closer to a top surface of the inter-layered insulating layer than a bottom surface of each of the plurality of second wires.

According to an exemplary embodiment of the present inventive concept, an image sensor is provided as follows. A substrate has a first surface and a second surface. A micro lens is disposed on the second surface of the substrate. A photoelectric conversion device is disposed in the substrate. A first reflector is disposed on the first surface of the substrate, with the first reflector overlapping the photoelectric conversion device. A second reflector is disposed on the first surface of the substrate, with the second reflector not overlapping the photoelectric conversion device. A top surface of the second reflector is closer to the first surface of the substrate than a bottom surface of the first reflector.

According to an exemplary embodiment of the present inventive concept, the first reflector and the second reflector are arranged so that the first reflector and the second reflector cooperatively reflect a first infrared light passing through the micro lens and the photoelectric conversion device to re-enter the photoelectric conversion device.

According to an exemplary embodiment of the present inventive concept, the image sensor further includes a gate electrode disposed on the first surface of the substrate. A top surface of the gate electrode is closer to the first surface of the substrate than a bottom surface of the second reflector.

According to an exemplary embodiment of the present inventive concept, the image sensor further includes an interlayered insulating layer disposed on the first surface of the substrate, the interlayered insulating layer covering the gate electrode, a first wire disposed on the interlayered insulating layer, and a contact plug penetrating the interlayered insulating layer and connecting a bottom surface of the first wire to the top surface of the gate electrode. The first wire, overlapping the gate electrode, is electrically connected to the gate electrode. The first reflector is disposed on the interlayered insulating layer so that the first reflector and the first wire are positioned at substantially the same height from the first surface of the substrate.

According to an exemplary embodiment of the present inventive concept, the image sensor further includes an inter-wire insulating layer disposed on the interlayered insulating layer, the inter-wire insulating layer covering the first reflector and the first wire, a third reflector disposed on the inter-wire insulating layer with the third reflector overlapping the photoelectric conversion device, and a fourth reflector disposed in the inter-wire insulating layer, with the fourth reflector overlapping the second reflector. The third reflector and the fourth reflector are arranged so that the third reflector and the fourth reflector cooperatively reflect a second infrared light passing through the micro lens, the photoelectric conversion device and the interlayered insulating layer to re-enter the photoelectric conversion device. According to an exemplary embodiment of the present inventive concept, a top surface of the fourth reflector is closer to a top surface of the interlayered insulating layer than a bottom surface of the third reflector.

According to an exemplary embodiment of the present inventive concept, the image sensor further includes a doped isolation surrounding the photoelectric conversion device. The second reflector and the doped isolation vertically overlap each other.

BRIEF DESCRIPTION OF DRAWINGS

These and other features of the present inventive concept will become more apparent by describing in detail exemplary embodiments thereof with reference to the accompanying drawings of which.

Figure 1:
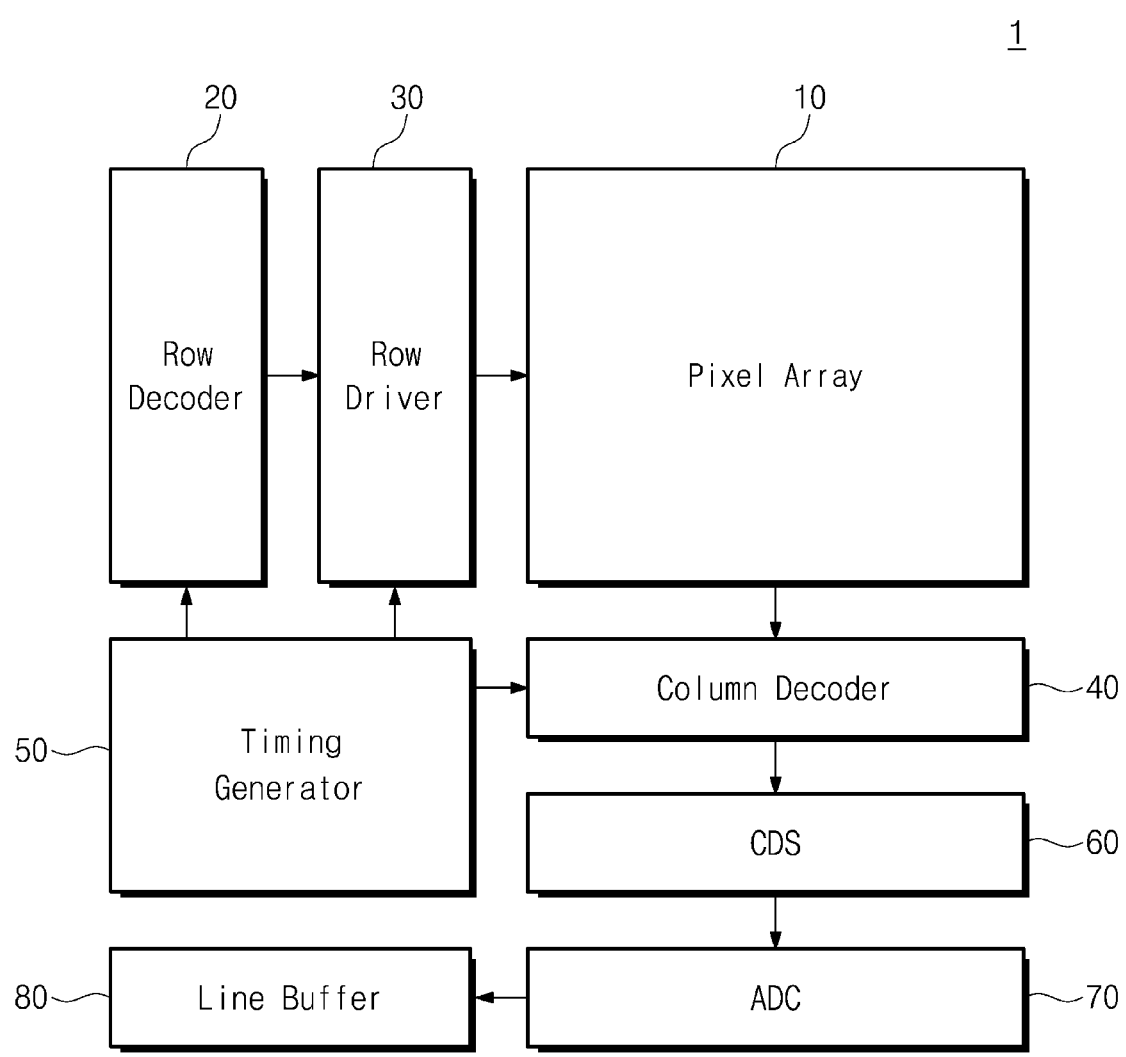
FIG. 1 is a block diagram of an image sensor according to an exemplary embodiment of the present inventive concept.

It should be noted that these figures are intended to illustrate the general characteristics of methods, structure and/or materials utilized in an exemplary embodiment and to supplement the written description provided below. These drawings are not, however, to scale and need not precisely reflect the precise structural or performance characteristics of any given exemplary embodiment, and should not be interpreted as defining or limiting the range of values or properties encompassed by an exemplary embodiment. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

The values such as height, thickness and width of a constituent element may be expressed using "substantially the same" or "about", because the values measured in an image sensor fabricated according to the present inventive concept may be different from the exact value claimed below due to a process variation for forming the image sensor or due to an measurement error.

FIG. 1 is a block diagram of an image sensor 1 according to an exemplary embodiment of the present inventive concept.

Referring to FIG. 1, the image sensor 1 may include a pixel array 10, a row decoder 20, a row driver 30, a column decoder 40, a timing generator 50, a correlated double sampler (CDS) 60, an analog-to-digital converter (ADC) 70, and a line buffer 80.

The pixel array 10 may include a plurality of unit pixel regions, which is arranged in rows and columns and serves to convert incident light to an electrical signal. The pixel array 10 may be driven by a plurality of driving signals (e.g., pixel selection signals, reset signals, and charge transfer signals), which are transferred from the row decoder 20.

The row decoder 20 may be configured to provide the driving signals to the rows of the unit pixel regions, respectively. Electrical signals, which are produced by the pixel array 10 in response to the driving signals, may be transferred to the correlated double sampler (CDS) 60.

The row driver 30 may also be configured to apply a plurality of driving signals, which are used to drive the plurality of unit pixel regions, to the pixel array 10, in response to the result decoded by the row decoder 20. In the case where the unit pixel regions are arranged in a matrix shape, the driving signals may be applied to the rows of the unit pixel regions, respectively.

The timing generator 50 may be configured to generate control signals (e.g., clock signals and timing control signals), which are used to control operations of the row and column decoders 20 and 40, the correlated double sampler 60, the analog-to-digital converter (ADC) 70, and the line buffer 80. The timing generator 50 may include a logic control circuit, a phase lock loop (PLL) circuit, a timing control circuit, a communication interface circuit, and so forth.

The correlated double sampler 60 may receive electric signals, which are generated in the pixel array 10, and may perform operations of holding and sampling the received electric signals. The correlated double sampler 60 may be configured to perform a double sampling operation, based on a specific noise level and a signal level of the electric signal, and to output a difference level corresponding to a difference between the noise and signal levels.

The analog-to-digital converter 70 may convert analog signals corresponding to the difference level outputted from the correlated double sampler 60 into digital signals and then may output the converted digital signals.

The line buffer 80 may latch the digital signals, which are outputted from the analog-to-digital converter 70, and then may output the latched digital signals sequentially to an image signal processing unit (not shown) in accordance with the decoding result obtained from the column decoder 40.

Figure 2:
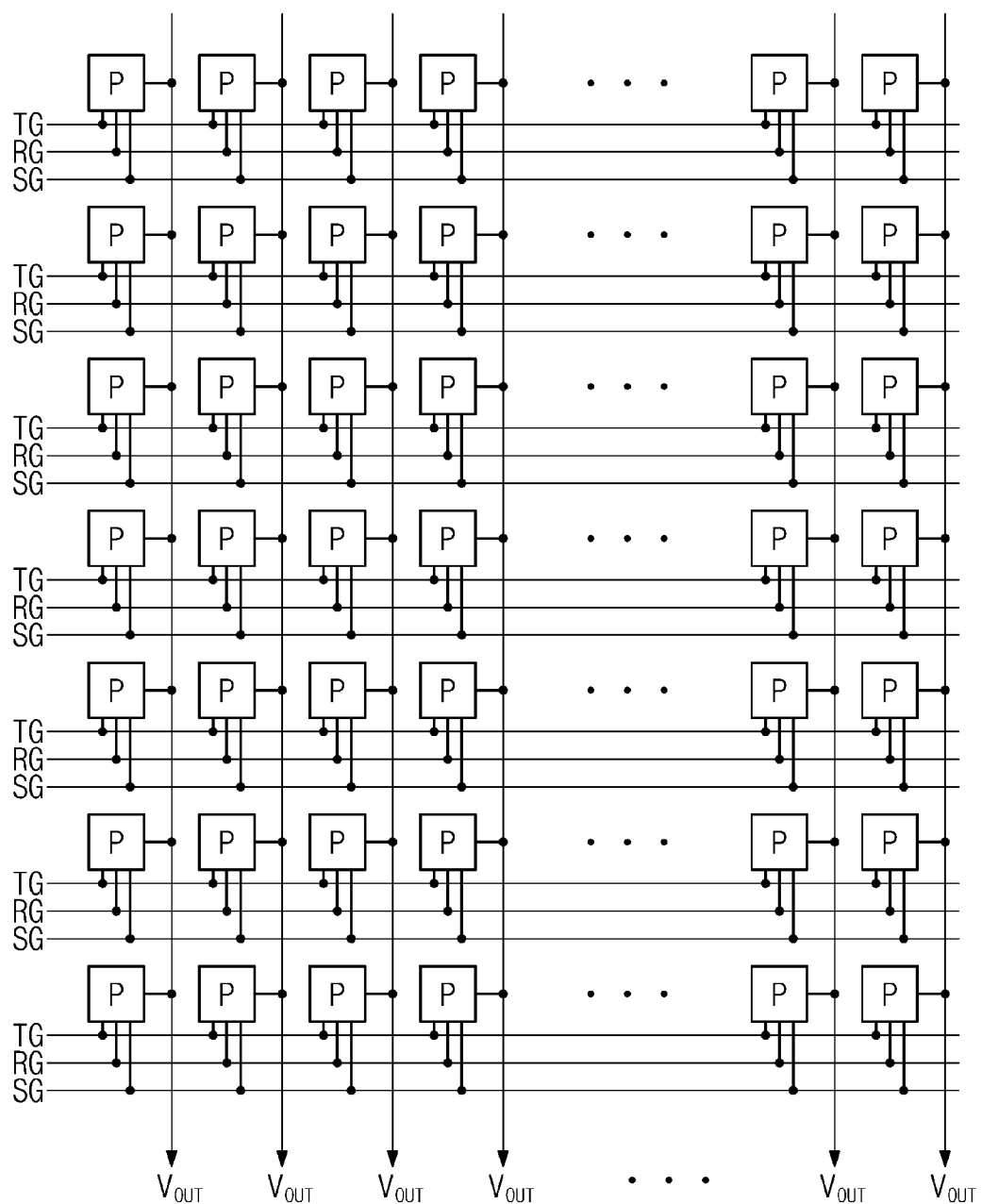
FIG. 2 is a block diagram of a pixel array of an image sensor according to an exemplary embodiment of the present inventive concept.

FIG. 2 is a block diagram of the pixel array 10 of the image sensor 1, according to an exemplary embodiment of the present inventive concept.

Referring to FIG. 2, the pixel array 10 may include a plurality of unit pixel regions P, which are two-dimensionally arranged in a plurality of rows and a plurality of columns.

Each of the unit pixel regions P may be configured to convert incident light to an electrical signal, and may be driven by driving signals, which are transferred through a charge transfer line TG, a reset line RG, and a pixel selection line SG. In an exemplary embodiment, the charge transfer line TG, the reset line RG, and the pixel selection line SG may be connected to a plurality of the unit pixel regions P. In addition, the electrical signals converted in the unit pixel regions P may be transferred to the correlated double sampler (e.g., see 60 of FIG. 1) through a plurality of output lines $V_{OUT}$.

Figure 3:
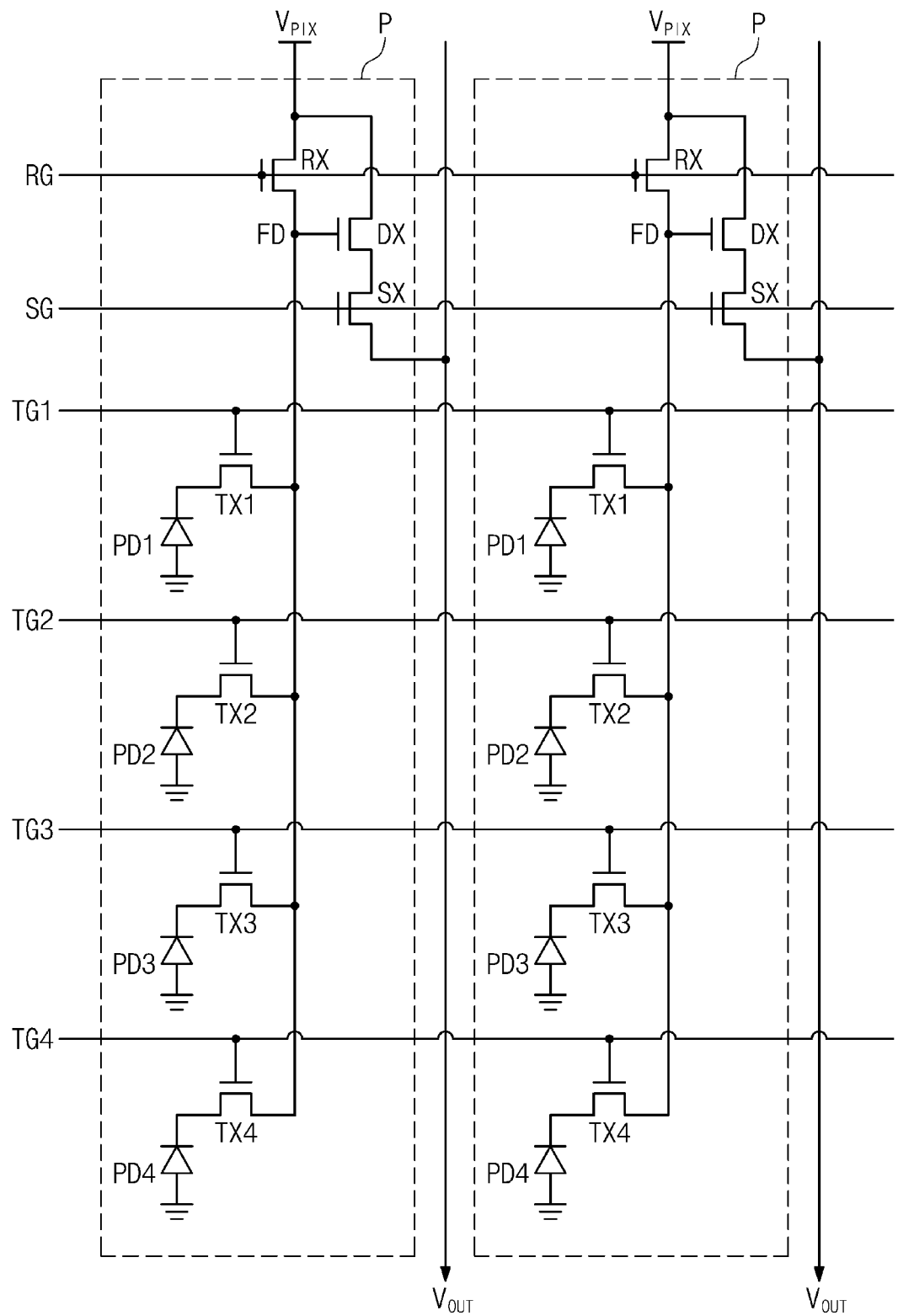
FIG. 3 is a circuit diagram of a pixel array of an image sensor according to an exemplary embodiment of the present inventive concept.

FIG. 3 is a circuit diagram of the pixel array 10 of the image sensor 1, according to an exemplary embodiment of the present inventive concept.

Referring to FIG. 3, the pixel array 10 may include a plurality of unit pixel regions P, which are two dimensionally arranged in rows and columns.

Each of the unit pixel regions P may include four photoelectric conversion devices PD1, PD2, PD3, and PD4 and four transfer transistors TX1, TX2, TX3, and TX4. Four transfer transistors TX1, TX2, TX3, and TX4 may be configured to share a charge-detection node FD and read circuits RX, SX and DX. Here, the read circuits may include a reset transistor RX, a selection transistor SX, and a drive transistor or a source-follower transistor DX. For the convenience of description, each unit pixel region P is assumed to have four photoelectric conversion devices PD1, PD2, PD3, and PD4; and each unit pixel region P is assumed to have four transfer transistors TX1, TX2, TX3, and TX4. The inventive concept, however, is not limited thereto. For example, each of the unit pixel regions P may include two photoelectric conversion devices and two transfer transistors, or five or more photoelectric conversion devices and transfer transistors.

The first to fourth photoelectric conversion devices PD1, PD2, PD3, and PD4 may be configured to generate photocharges in proportion to an amount of incident light and to store the photocharges therein. Each of the first to fourth photoelectric conversion devices PD1, PD2, PD3, and PD4 may be provided in a form of a photo diode, a photo transistor, a photo gate, a pinned photo diode (PPD), or any combination thereof.

The first to fourth transfer transistors TX1, TX2, TX3, and TX4 may serve to control an operation of transferring the charges, which are stored in the first to fourth photoelectric conversion devices PD1, PD2, PD3, and PD4, to the charge-detection node FD. The first to fourth transfer transistors TX1, TX2, TX3, and TX4 may be controlled by charge transfer signals, which are transmitted through first to fourth charge transfer lines TG1, TG2, TG3, and TG4, and the charges stored in the first to fourth photoelectric conversion devices PD1, PD2, PD and PD4 may be selectively transmitted from one of the first to fourth photoelectric conversion devices PD1, PD2, PD3, and PD4 to the charge-detection node FD, depending on the charge transfer signals applied to the first to fourth transfer transistors TX1, TX2, TX3, and TX4. Hereinafter, the first to fourth charge transfer lines TG1, TG2, TG3, and TG4 will be referred to as first to fourth transfer gates TG1, TG2, TG3, and TG4, respectively. In an exemplary embodiment, the first to fourth transfer gates TG1, TG2, TG3 and TG4 may be part of the first to fourth charge transfer lines TG1, TG2, TG3, and TG4, respectively.

The charge-detection node FD may be configured to cumulatively store the charges transferred from the first to fourth photoelectric conversion devices PD1, PD2, PD3, and PD4. For example, the charges (or photocharges) transferred from the first to fourth photoelectric conversion devices PD1, PD2, PD3, and PD4 through the first to fourth transfer gates TG1, TG2, TG3 and TG4 to the charge-detection node FD may be accumulated or stored at the charge-detection node FD. An operation of the drive transistor DX may be controlled, depending on an amount of the photocharges stored in the charge-detection node FD.

The reset transistor RX may be configured to periodically discharge the photocharges stored at the charge-detection node FD. The reset transistor RX may include drain and source electrodes, which are respectively connected to the charge-detection node FD and a node applied with a pixel power voltage $V_{PIX}$. If the reset transistor RX is turned on, the pixel power voltage $V_{PIX}$ may be applied to the charge-detection node FD through the source electrode of the reset transistor RX. For example, if the reset transistor RX is turned on, the photocharges stored at the charge-detection node FD may be discharged to the power voltage VDD through the reset transistor RX.

The drive transistor DX may be a source-follower buffer amplifier, which is configured to generate a source-to-drain current, in response to an amount of electric charges to be supplied to its gate electrode. The drive transistor DX may be configured to amplify a variation in electric potential of the charge-detection node FD and then to output the amplified signal to the output line $V_{OUT}$ through the selection transistor SX. A source electrode of the drive transistor DX may be connected to the pixel power voltage $V_{PIX}$, and a drain electrode of the drive transistor DX may be connected to the source electrode of the selection transistor SX. In an exemplary embodiment, the transistors RX, DX and SX each may be formed of an N-type metal-oxide-semiconductor (NMOS) transistor.

The selection transistor SX may serve to select one of the rows and columns of the unit pixel regions P. When the selection transistor SX is turned on, the selection transistor SX may serve to output an electrical signal, which is outputted to the drain electrode of the drive transistor DX, to the output line $V_{OUT}$.

Figure 4A:
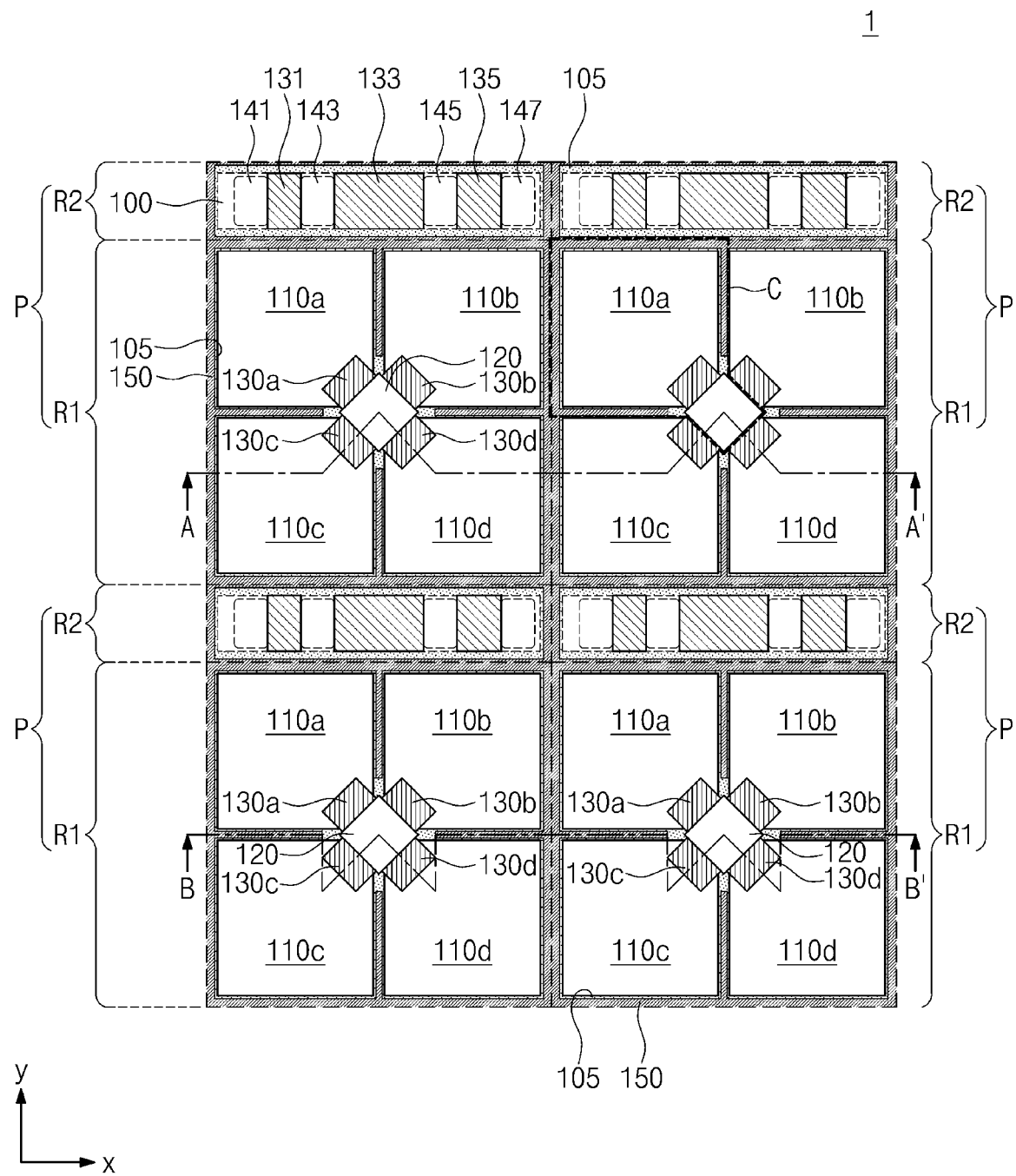
FIG. 4A is a schematic plan view of an image sensor according to an exemplary embodiment of the present inventive concept.
Figure 4B:
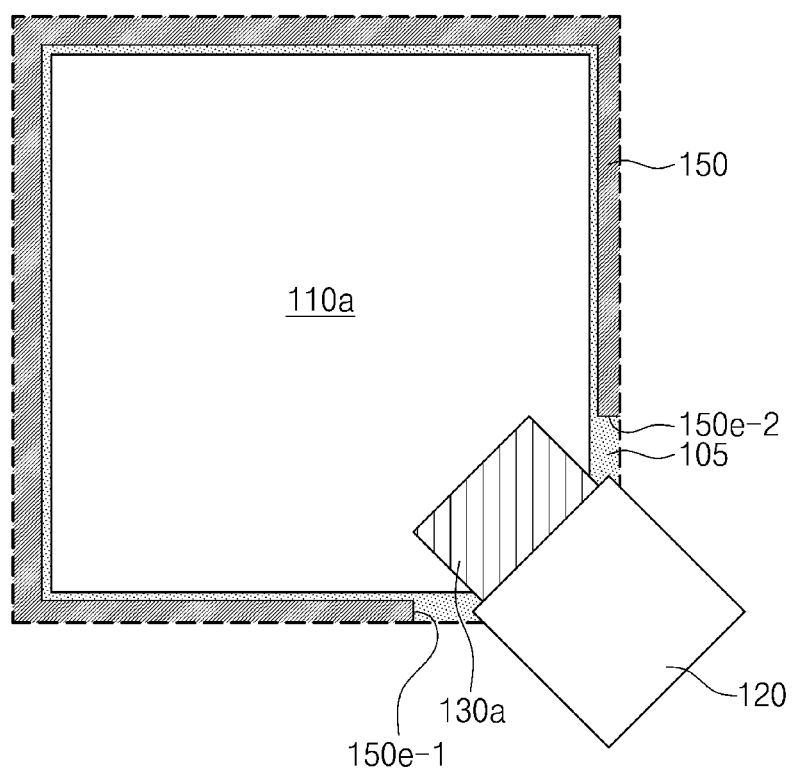
FIG. 4B is an enlarged view of a portion 'C' of FIG. 4A according to an exemplary embodiment of the present inventive concept.
Figure 5A:
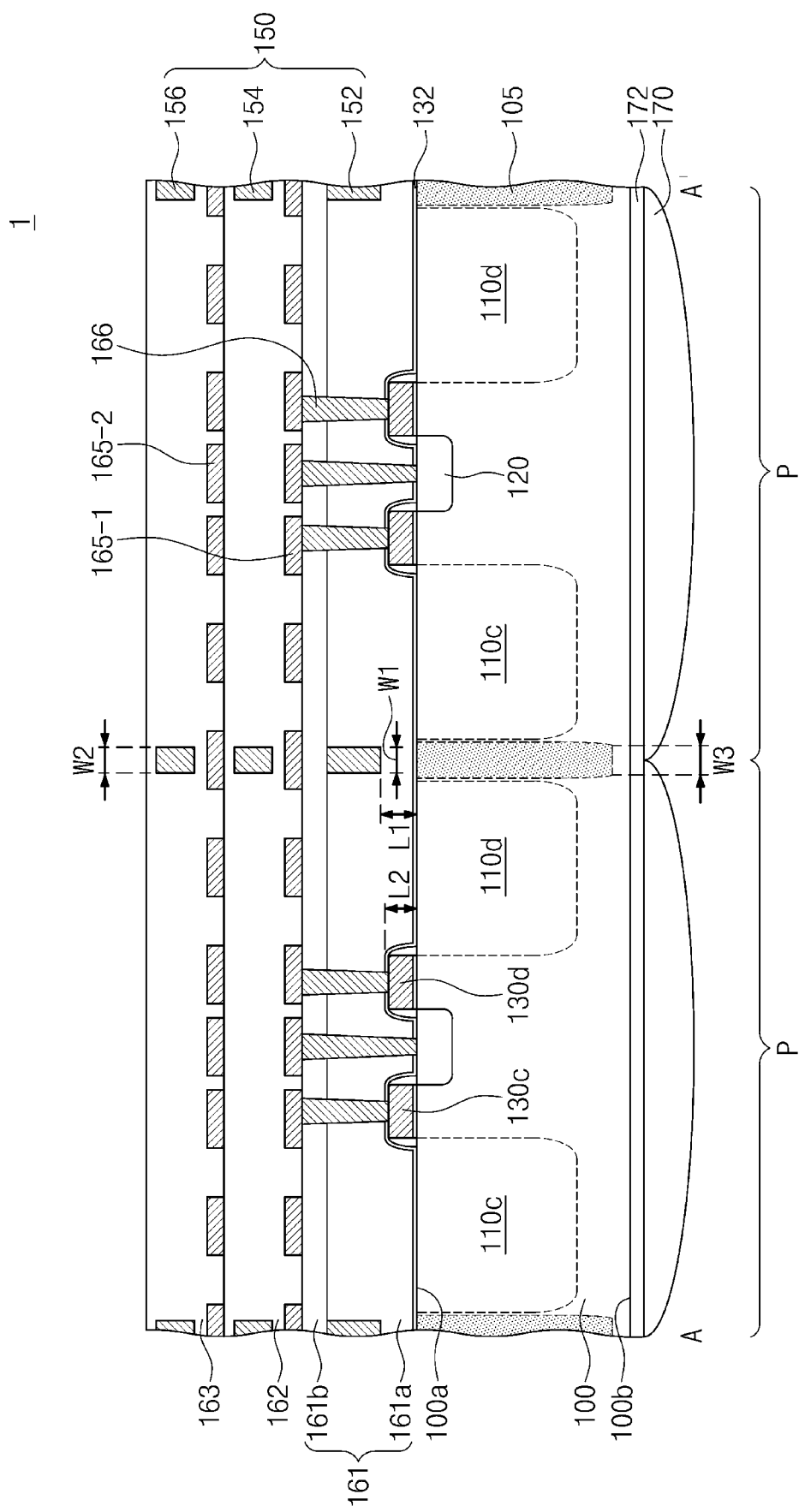
FIG. 5A is a sectional view taken along line A-A' of FIG. 4A according to an exemplary embodiment of the present inventive concept.
Figure 5B:
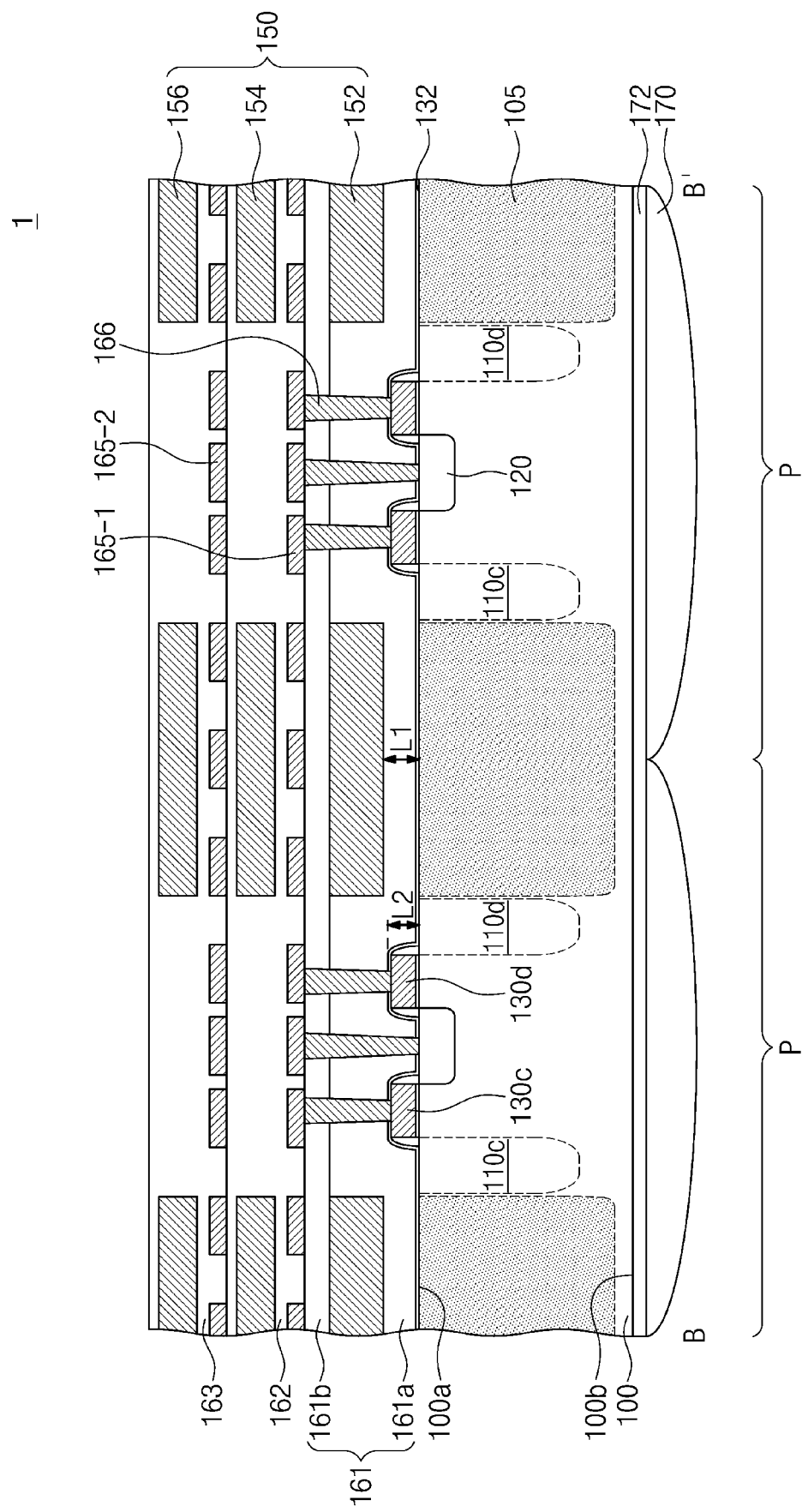
FIG. 5B is a sectional view taken along line B-B' of FIG. 4A according to an exemplary embodiment of the present inventive concept.

FIG. 4A is a schematic plan view of the image sensor 1 according to an exemplary embodiment of the present inventive concept, and FIG. 4B is an enlarged view of a portion 'C' of FIG. 4A. FIG. 5A is a sectional view taken along line A-A' of FIG. 4A, and FIG. 5B is a sectional view taken along line B-B' of FIG. 4A.

Referring to FIGS. 4A to 5B, a semiconductor substrate 100 including a plurality of unit pixel regions P may be provided. The semiconductor substrate 100 may be of a first conductivity type (e.g., p-type). The semiconductor substrate 100 may have a first surface 100a and a second surface 100b facing each other. For example, the first surface 100a may be a top or front surface of the semiconductor substrate 100, and the second surface 100b may be a bottom or rear surface of the semiconductor substrate 100. Circuits may be provided on the first surface 100a, and light including an infrared light may be incident to the second surface 100b. In an exemplary embodiment, the semiconductor substrate 100 may be a silicon epitaxial layer that is doped with p-type impurities, but the present inventive concept is not limited thereto.

When viewed in a plan view, the unit pixel regions P may be arranged in a matrix shape (i.e., in x and y directions). Each of the unit pixel regions P may include a photoelectric conversion region R1 and a read circuit region R2. The photoelectric conversion region R1 and the read circuit region R2 may be defined by a doped isolation layer 105. The photoelectric conversion regions R1 of the unit pixel regions P may be arranged to be adjacent to each other in the x direction, and the read circuit regions R2 of the unit pixel regions P may be arranged to be adjacent to the photoelectric conversion regions R1 in the y direction.

The doped isolation layer 105 may be formed by injecting the first conductivity type impurities (e.g., p-type impurities) into the semiconductor substrate 100. A concentration of p-type impurities may be higher in the doped isolation layer 105 than in the semiconductor substrate 100. For example, the doped isolation layer 105 and the semiconductor substrate 100 may be doped with the same type of impurities.

The doped isolation layer 105 may include first portions extending in the x direction and second portions extending in the y direction. Within each of the photoelectric conversion regions R1, the doped isolation layer 105 may be formed to have a lattice or grid shape.

The first portions of the doped isolation layer 105 may be placed between the photoelectric conversion region R1 and the read circuit region R2, and the second portions of the doped isolation layer 105 may be placed between photoelectric conversion devices 110a-110d adjacent to each other in the x direction. The first and second portions of the doped isolation layer 105 may be provided to have substantially the same impurity concentration.

However, the present inventive concept is not limited thereto. For example, the doped isolation layer may be omitted.

A plurality of photoelectric conversion devices may be provided in the semiconductor substrate 100 of the photoelectric conversion region R1. For example, first to fourth photoelectric conversion devices 110a, 110b, 110c, and 110d may be formed in the semiconductor substrate 100 of the photoelectric conversion region R1. The first to fourth photoelectric conversion devices 110a-110d may be arranged in a matrix shape or in the x and y directions, when viewed in a plan view.

The first to fourth photoelectric conversion devices 110a-110d may be formed by injecting second conductivity type impurities into the semiconductor substrate 100. For example, the second conductivity type may be an n-type. Since the semiconductor substrate 100 and the first to fourth photoelectric conversion devices 110a-110d have different conductivity types (e.g., the first and second conductivity types), PN junctions formed between the photoelectric conversion devices 110a-110d and the semiconductor substrate 100 may serve as photodiodes. Hereinafter, the PN junctions may be part of the photoelectric conversion devices 110a-110d.

In each of the photoelectric conversion regions R1, the first to fourth photoelectric conversion devices 110a-110d may be spaced apart from each other by the doped isolation layer 105. For example, the doped isolation layer 105 may be provided to enclose each of the first to fourth photoelectric conversion devices 110a-110d. For example, when viewed in the x direction, the doped isolation layer 105 may be provided between adjacent pairs of the first and second photoelectric conversion devices 110a and 110b and between adjacent pairs of the third and fourth photoelectric conversion devices 110c and 110d. When viewed in the y direction, the doped isolation layer 105 may be provided between adjacent pairs of the first and third photoelectric conversion devices 110a and 110c and between adjacent pairs of the second and fourth photoelectric conversion devices 110b and 110d.

The doped isolation layer 105 may have a conductivity type different from a conductivity type of the first to fourth photoelectric conversion devices 110a-110d and thus, a potential barrier may be formed between the doped isolation layer 105 and the first to fourth photoelectric conversion devices 110a-110d. For example, due to the doped isolation layer 105, a potential well may be formed in each of the first to fourth photoelectric conversion devices 110a-110d.

Since the first to fourth photoelectric conversion devices 110a-110d are separated from each other by the doped isolation layer 105, an insulating material, of which a refractive index is different from a refractive index of the semiconductor substrate 100, may be provided between the first to fourth photoelectric conversion devices 110a-110d to suppress the refraction or reflection of incident light. Since the first to fourth photoelectric conversion devices 110a-110d are separated from each other by the doped isolation layer 105, it may be possible to prevent lattice defects (e.g., dangling bonds) from being produced in the first to fourth photoelectric conversion devices 110a-110d, when a structure (e.g., insulating layer) for isolating the first to fourth photoelectric conversion devices 110a-110d is formed in the semiconductor substrate 100.

Although not shown, a well region (not shown) of a first conductivity type may be formed in an upper portion of each of the first to fourth photoelectric conversion devices 110a-110d to prevent a dark current from occurring. The well region (not shown) may be formed by shallowly doping the surface of each of the first to fourth photoelectric conversion devices 110a-110d with impurities of the first conductivity type.

In each of the unit pixel regions P, a common floating diffusion region 120 may be provided in a center region of the photoelectric conversion region R1. The common floating diffusion region 120 may be formed by injecting second conductivity type impurities (e.g., n-type impurities) into the semiconductor substrate 100. In an exemplary embodiment, each of the unit pixel regions P may include a predetermined number of photoelectric conversion devices sharing the common floating diffusion region 120. In FIG. 4A, four photoelectric conversion devices 110a, 110b, 110c and 110d may share the common floating diffusion region 120 to constitute each of the unit pixel regions P. The present inventive concept is not limited thereto. For example, the predetermined number of photoelectric conversion devices may be two, three, or more than four.

First to fourth transfer gate electrodes 130a, 130b, 130c, and 130d may be provided on the photoelectric conversion region R1 of the semiconductor substrate 100. The first to fourth transfer gate electrodes 130a, 130b, 130c, and 130d each may be provided between one of the first to fourth photoelectric conversion devices 110a-110d and the common floating diffusion region 120, respectively. For example, the first transfer gate electrode 130a may be disposed between the first photoelectric conversion device 110a and the common floating diffusion region 120; the second transfer gate electrode 130b may be disposed between the second photoelectric conversion device 110b and the common floating diffusion region 120; the third transfer gate electrode 130c may be disposed between the third photoelectric conversion device 110c and the common floating diffusion region 120; and the fourth transfer gate electrode 130d may be disposed between the fourth photoelectric conversion device 110d and the common floating diffusion region 120.

Gate insulating layers each may be interposed between one of the first to fourth transfer gate electrodes 130a, 130b, 130c, and 130d and the first surface 100a of the semiconductor substrate 100. An etch stop layer 132 may be formed on the first to fourth transfer gate electrodes 130a, 130b, 130c, and 130d and the first surface 100a of the semiconductor substrate 100. For example, the etch stop layer 132 may cover the first to fourth transfer gate electrodes 130a, 130b, 130c, and 130d.

Referring to FIGS. 4A and 4B, a grid pattern 150 may be provided to enclose each of the first to fourth photoelectric conversion devices 110a-110d of the photoelectric conversion region R1. When viewed in a plan view, the grid pattern 150 may be provided to enclose an edge region of each of the first to fourth photoelectric conversion devices 110a-110d, and end portions 150e-1 and 150e-2 of the grid pattern 150 may be separated from each other at a portion of the edge region. For example, as shown in FIG. 4B, the grid pattern 150 enclosing an edge region of the first photoelectric conversion device 110a may be cut at a corner region of the first photoelectric conversion device 110a so that the grid pattern 150 includes a first end portion 150e-1 and a second end portion 150e-2. The first transfer gate electrode 130a and the common floating diffusion region 120 are provided on the corner region of the first photoelectric conversion device 110a. In an exemplary embodiment, the first end portion 150e-1 and the second end portion 150e-2 may be separated from each other to the extent that the first transfer gate electrode 130a is disposed between the first end portion 150e-1 and the second end portion 150e-2. As shown in FIG. 4A, when viewed in a plan view, the grid pattern 150 may have a lattice or grid structure, but it may be cut at a region within the photoelectric conversion region R1. For example, the grid pattern 150 may be cut at a center region of the photoelectric conversion region R1.

For example, the grid pattern 150 may be of a rectangular pattern enclosing the first photoelectric conversion device 110a and having the first end portion 150e-1 and the second end portion 150e-2. In this case, the grid pattern 150 of FIG. 4A may be a network of rectangular patterns, each of the rectangular patterns enclosing its corresponding photoelectric conversion device and having the first end portion 150e-1 and the second end portion 150e-2 that are separated from each other to the extent that a gate electrode for the photoelectric conversion device is disposed therebetween. The present inventive concept, however, is not limited thereto. For example, the presence or absence of the end portions 150e-1 and 150e-2 of the grid pattern 150 and their positions may be changed, depending on the arrangement of transfer gate electrodes 130a, 130b, 130c, and 130d and the common floating diffusion region 120. For example, the grid pattern may be of a polygonal pattern other than the rectangular pattern.

In an exemplary embodiment, the grid pattern 150, when viewed in a plan view, may overlap a region between two adjacent photoelectric conversion devices of the plurality of photoelectric conversion devices 110a, 110b, 110c and 110d. For example, a part of the grid pattern 150 may be disposed between two adjacent photoelectric conversion devices 110a and 110b along a first direction (x-axis); a part of the grid pattern 150 may be disposed between two adjacent photoelectric conversion devices 110a and 110c along a second direction (y-axis).

When viewed in a plan view, the grid pattern 150 may overlap with the doped isolation layer 105 between the first to fourth photoelectric conversion devices 110a-110d of the semiconductor substrate 100. When viewed in a plan view, the grid pattern 150 may overlap with the doped isolation layer 105 between the first to fourth photoelectric conversion devices 110a-110d of the photoelectric conversion region R1. In the case where the doped isolation layer is omitted, the grid pattern 150 may vertically overlap with some regions of the semiconductor substrate 100 between the first to fourth photoelectric conversion devices 110a-110d. The grid pattern 150 may be provided in at least one of an interlayered insulating layer 161 and inter-wire insulating layers 162 and 163. This will be described in more detail below.

Referring to FIGS. 5A and 5B, an interconnection structure may be disposed on the first surface 100a of the semiconductor substrate 100. The interconnection structure may include a plurality of wires 165-1 and 165-2 and contact plugs 166, which are electrically connected to the logic transistors (e.g., see RX, SX, and DX of FIG. 3). For example, the interlayered insulating layer 161 and the inter-wire insulating layers 162 and 163 may be provided on the first surface 100a of the semiconductor substrate 100. The interlayered insulating layer 161 may include first and second interlayered insulating layers 161a and 161b, which are sequentially stacked. The interlayered insulating layer 161 may be provided to cover the first to fourth transfer gate electrodes 130a, 130b, 130c, and 130d and the etch stop layer 132. The inter-wire insulating layers 162 and 163 may be placed on the interlayered insulating layer 161. The inter-wire insulating layers 162 and 163 may include a first inter-wire insulating layer 162 and a second inter-wire insulating layer 163, which are sequentially stacked on each other. Although two inter-wire insulating layers (e.g., 162 and 163) are illustrated, the number of the inter-wire insulating layers may not be limited thereto.

The contact plugs 166 and the plurality of wires 165-1 and 165-2 may be provided in the interlayered insulating layer 161 and the inter-wire insulating layers 162 and 163. For example, the plurality of wires 165-1 and 165-2 may include a plurality of first wires 165-1 covered by the first inter-wire insulating layer 162 and a plurality of second wires 165-2 covered by the second inter-wire insulating layer 163. The contact plugs 166 may be provided to penetrate the inter-layered insulating layer 161. In an exemplary embodiment, the contact plugs 166 may be provided to further penetrate the etch stop layer 132 to be electrically connected to the first to fourth transfer gate electrodes 130a, 130b, 130c or the common floating diffusion region 120. In an exemplary embodiment, the contact plugs 166 may include FD contact plugs, which are coupled to the common floating diffusion region 120, and gate contact plugs, which are coupled to the first to fourth transfer gate electrodes 130a, 130b, 130c, and 130d, respectively. The wires 165-1 and 165-2 may be provided on the interlayered insulating layer 161 or on the inter-wire insulating layers 162 and 163. At least one or each of the plurality of first wires 165-1 and the contact plugs 166 may be electrically connected to a corresponding one of the common floating diffusion regions 120, a corresponding one of the transfer gate electrodes 130a, 130b, 130c and 130d, a power line through which the pixel power voltage (e.g., see $V_{PIX}$ of FIG. 3) is supplied, or the output line (e.g., see $V_{OUT}$ of FIG. 3).

The grid pattern 150 may be provided in at least one of the interlayered insulating layer 161 and the inter-wire insulating layers 162 and 163. The grid pattern 150 may include a first grid pattern 152, which is provided in the interlayered insulating layer 161, and second grid patterns 154 and 156, which are provided in the inter-wire insulating layers 162 and 163. In an exemplary embodiment, the first and second grid patterns 152, 154, and 156 may overlap each other, when viewed in a plan view.

Via plugs (not shown) may be provided in the inter-wire insulating layers 162 and 163. For example, some of the via plugs may penetrate the first inter-wire insulating layer 162 to connect one of the plurality of first wires 165-1 to one of the plurality of second wires 165-2.

The first grid pattern 152 may be provided in the inter-layered insulating layer 161. The first grid pattern 152 may be provided in such a way that top and bottom surfaces thereof are respectively spaced apart from top and bottom surfaces of the interlayered insulating layer 161. When measured from the first surface 100a, a level L1 of a bottom surface of the first grid pattern 152 may be higher than a level L2 of the topmost surface of the etch stop layer 132. For example, when measured from the first surface 100a, the bottom surface of the first grid pattern 152 at the level L1 may be higher than portions of the etch stop layer 132, which are located on the first to fourth transfer gate electrodes 130a, 130b, 130c, and 130d or at the level L2. When measured from the first surface 100a, the bottom surface of the first grid pattern 152 at the level L1 may be higher than top surfaces of the first to fourth transfer gate electrodes 130a, 130b, 130c, and 130d. Thus, it may be possible to prevent the first to fourth transfer gate electrodes 130a, 130b, 130c, and 130d, which are formed in advance, from being damaged, when an etching process forms the first grid pattern 152.

The second grid patterns 154 and 156 may be provided the inter-wire insulating layers 162 and 163, respectively. For example, the second grid pattern 154 may be provided in the first inter-wire insulating layer 162, and the second grid pattern 156 may be provided in the second inter-wire insulating layer 163. Each of the second grid patterns 154 and 156 may be provided in such a way that top and bottom surfaces thereof are respectively spaced apart from top and bottom surfaces of a corresponding one of the inter-wire insulating layers 162 and 163.

A width W1 of the first grid pattern 152 may be smaller than a width W3 of the doped isolation layer 105. The width W3 of the doped isolation layer 105 may be substantially equal to the minimum width of the doped isolation layer 105. Each of the second grid patterns 154 and 156 may have a width W2 that is smaller than the width W3 of the doped isolation layer 105. The width W2 of the second grid patterns 154 and 156 may be substantially equal to the width W1 of the first grid pattern 152, but the inventive concept is not limited thereto. For example, the width W2 may be smaller than the width W1 of the first grid pattern 152. Since, when viewed in a plan view, the widths W1 and W2 of the grid pattern 150 are smaller than the width W3 of the doped isolation layer 105, it may be possible to reduce an area of an optical dead zone, which is caused by overlapping between the grid pattern 150 and the semiconductor substrate 100.

Micro lenses 170 may be placed on the second surface 100b of the semiconductor substrate 100. An anti-reflection layer 172 may be provided between the second surface 100b of the semiconductor substrate 100 and the micro lenses 170. The anti-reflection layer 172 may prevent light incident to the second surface 100b of the semiconductor substrate 100, from being reflected so the incident light propagates toward the first to fourth photoelectric conversion devices 110a-110d.

The micro lens 170 may have a convex surface with a predetermined curvature radius. The micro lens 170 may be provided to face the unit pixel regions P, respectively. The micro lens 170 may be formed of an optically transparent resin and may be used to concentrate the incident light on a corresponding one of the unit pixel regions P.

Figure 5C:
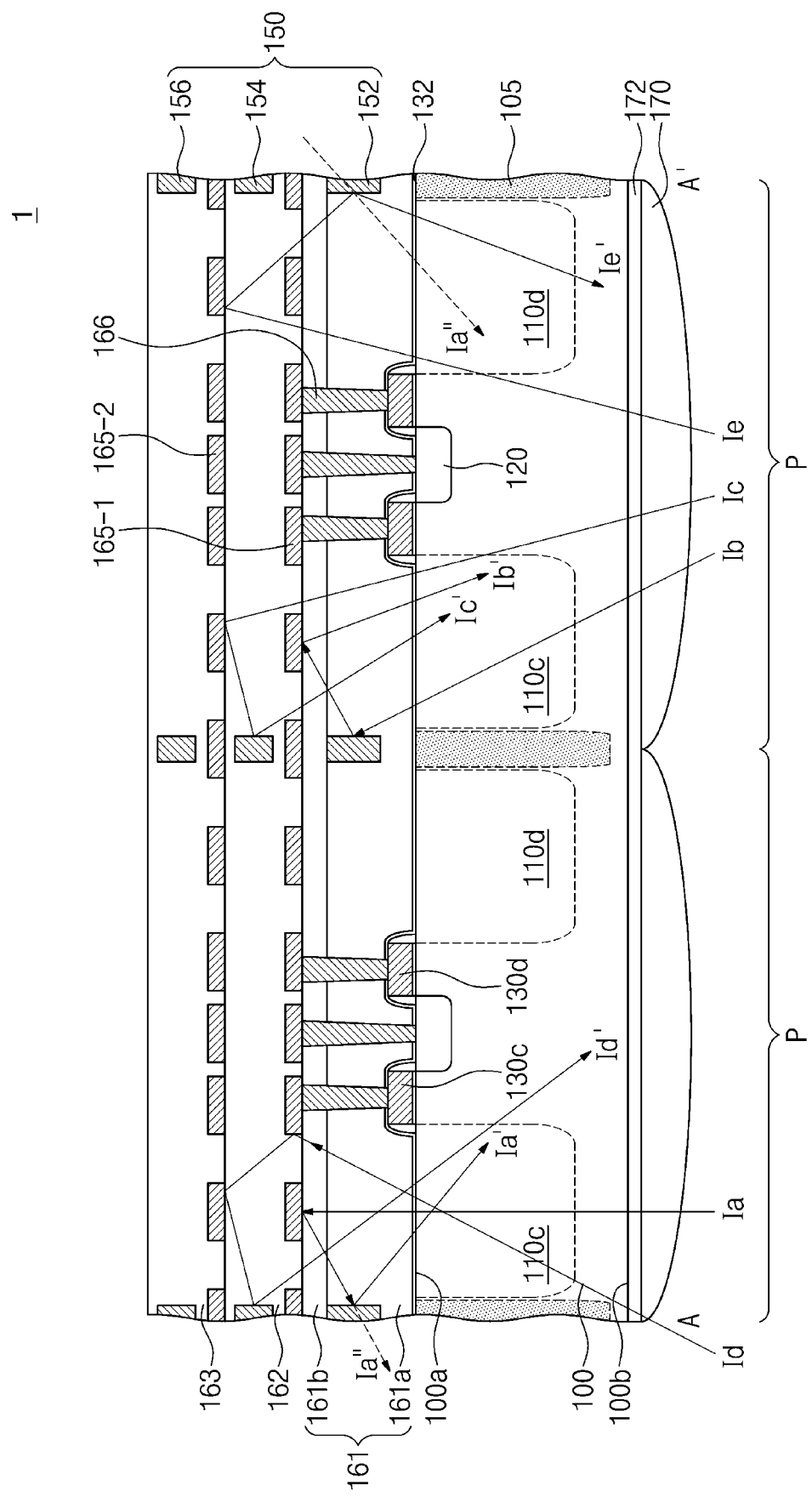
FIG. 5C is a diagram illustrating propagating paths of infrared light beams incident into the image sensor of FIG. 5A according to an exemplary embodiment of the present inventive concept.

FIG. 5C is a diagram exemplarily illustrating propagating paths of light beams Ia, Ib, Ic, Id and Ie ("Ia to Ie") to be incident into the image sensor 1 of FIG. 5A. The light beams Ia to Ie may have a long wavelength of about 700 nm or longer. For example, the light beams Ia to Ie may be infrared light. In the case where the infrared light beams Ia to Ie are incident into the image sensor 1 through the second surface 100b, the infrared light beams Ia to Ie may reach structures (e.g., the interlayered and inter-wire insulating layers) provided on the first surface 100a, because the infrared light exhibits a relatively long penetration property, compared with short wavelength light (e.g., ultraviolet and visible light). If the grid pattern 150 is not present in the propagating path, the infrared light beam Ia, for example, incident into a specific unit pixel region to a deep depth, may be reflected by the wires 165-1 and 165-2 into another neighboring unit pixel region as a reflected infrared light Ia". In this case, the image sensor may suffer from a cross-talk phenomenon.

Referring to FIG. 5C, the first grid pattern 152 may be configured to reflect a vertically-incident light Ia coming through a micro lens 170 into one of the photoelectric conversion devices 110a, 110b, 110c and 110d of the unit pixel region P back to the same photoelectric conversion device through which the vertically-incident light Ia passes. For example, the vertically-incident light Ia may be incident on the third photoelectric conversion device 110c through the micro lens 170 and its reflected light Ia' may be reflected back into (or re-enter) the third photoelectric conversion device 110c. Without the first grid pattern 152, the reflected light Ia" may enter another photoelectric conversion device 110d different from the photoelectric conversion device 110c through which its incoming light Ia passes. The first grid pattern 152 may also be configured to reflect a slantingly-incident light Ib coming into one of the photoelectric conversion devices 110a, 110b, 110c and 110d of the unit pixel region P back to the same photoelectric conversion device. For example, the slantingly-incident light Ib may be incident on the third photoelectric conversion device 110c through the micro lens 170 and its reflected light Ib' may be reflected back into (or re-enter) the third photoelectric conversion device 110c of the unit pixel region P through which the slantingly-incident light Ib passes from the micro lens 170. According to an exemplary embodiment, owing to the grid pattern 150, it may be possible to increase an amount of light to be incident into each unit pixel region P and consequently to increase sensitivity and signal-to-noise ratio (SNR) characteristics of the image sensor. Although, for the sake of brevity, FIG. 5C illustrates only an example, in which the incident lights Ia and Ib are reflected by the first grid pattern 152, but the second grid patterns 154 and 156 may show the same technical effect as the first grid pattern 152.

In an exemplary embodiment, at least one of the grid patterns 152 and 154, and at least one of the plurality of wires 165-1 and 165-2 may serve as a reflector if they cooperatively reflect an incoming infrared light so that its reflected light re-enters the same photoelectric conversion device through which the incoming light enters from a micro lens. Specifically, the grid patterns 152 and 154 may serve as reflectors; and the at least one of the plurality of wires 165-1 and 165-2 may serve both as a reflector and a signal path. For example, one of the plurality of first wires 165-1 may be serve as a reflector and a part of a signal path, and the remaining ones of the plurality of first wires 165-1 serve as the signal path. In this case, the reflector (the one of the plurality of first wires 165-1) and the remaining ones of the plurality of first wires 165-1 may be positioned at substantially the same height from the semiconductor substrate 100.

For example, one of the plurality of first wires (first reflector) 165-1 and the first grid pattern 152 (second reflector) may cooperatively reflect the incoming infrared lights Ia and Ib to re-enter the same photoelectric conversion device through which the incoming infrared lights Ia and Ib passes. In this case, the one of the plurality of first wires (first reflector) may overlap the photoelectric conversion device; and the first grid pattern 152 (second reflector) may not overlap the photoelectric conversion device.

The present inventive concept is not limited thereto. For example, one of the plurality of second wires 165-2 (third reflector) and the second grid pattern 154 (fourth reflector) may cooperatively reflect an incoming infrared light Ic so that its reflected light Ic' re-enters the same photoelectric conversion device through which the incoming infrared light Ic enters. In this case, the one of the plurality of second wires 165-2 (third reflector) may overlap the photoelectric conversion device through which the incoming infrared light Ic enters; and the second grid pattern 154 (fourth reflector) does not overlap the photoelectric conversion device.

For example, one of the plurality of first wires 165-1 (first reflector), one of the plurality of second wires 165-2 (third reflector) and the second grid pattern 154 (fourth reflector) may cooperatively reflect an incoming light Id so that its reflected light Id' re-enters the same photoelectric conversion device through which the incoming light Id passes. In this case, the one of the plurality of first wires 165-1 (first reflector) and the one of the plurality of second wires 165-2 (third reflector) may overlap the photoelectric conversion device; and the second grid pattern 154 (fourth reflector) does not overlap the photoelectric conversion device.

For example, one of the plurality of second wires 165-2 (a third reflector) and the first grid pattern 152 (a second reflector) may cooperatively reflect an incoming light Ie so that its reflected light Ie' re-enters the same photoelectric conversion device. The present inventive concept is not limited thereto. For example, depending on the traveling path of an incoming light from a micro lens, any combination of the plurality of wires 165-1 and 165-2, the first grid pattern 152 and the second grid pattern 154 may reflect cooperatively the incoming light so that its reflected light re-enters the same photoelectric conversion device to increase the light sensitivity of the photoelectric conversion device and suppress a cross talk between the photoelectric conversion device and its neighboring photoelectric conversion device.

According to an exemplary embodiment, at least two reflectors positioned different heights may reflect an incoming light to re-enter a photoelectric conversion device through which the incoming light enters from a micro lens. In an exemplary embodiment, the incoming light may be an infrared light.

Referring back to FIGS. 4A and 4B, the drive transistor DX, the reset transistor RX, and the selection transistor SX of FIG. 3 may be provided on the read circuit region R2 of the semiconductor substrate 100. In each of the unit pixel regions P, a drive gate electrode 133 may be provided between a selection gate electrode 131 and a reset gate electrode 135.

First and second source/drain regions 141 and 143 may be respectively formed at both sides of each selection gate electrode 131 in the semiconductor substrate 100. Third and fourth source/drain regions 145 and 147 may be respectively formed at both sides of each reset gate electrode 135 in the semiconductor substrate 100. The first to fourth source/drain regions 141, 143, 145, and 147 may be formed by injecting impurities of the second conductivity type (e.g., n-type) into the semiconductor substrate 100. The drive gate electrode 133 may share the second source/drain region 143 and the third source/drain region 145 with the selection gate electrode 131 and the reset gate electrode 135, respectively.

In an exemplary embodiment, the first source/drain region 141 may be electrically connected to the output line $V_{OUT}$, and the second source/drain region 143 may be used as a drain electrode of the drive transistor. The third source/drain region 145 between the drive gate electrode 133 and the reset gate electrode 135 may be electrically connected to a pixel power voltage (not shown). The fourth source/drain region 147, in conjunction with the drive gate electrode 133, may be electrically connected to the common floating diffusion region 120 through a conductive line (not shown).

Figure 6A:
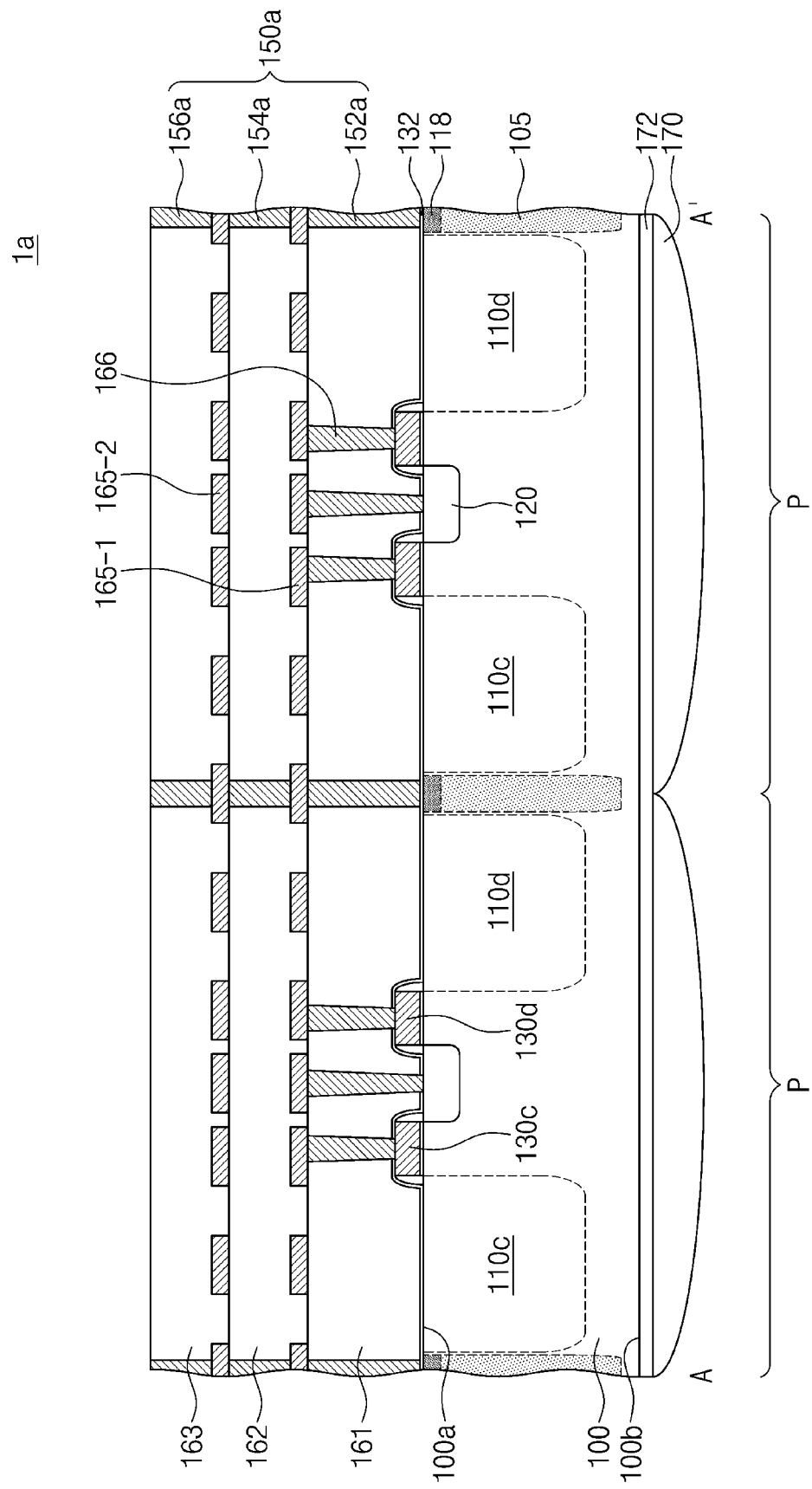
FIG. 6A is a sectional view, which is taken along line A-A' of FIG. 4A to illustrate an image sensor according to an exemplary embodiment of the present inventive concept.
Figure 6B:
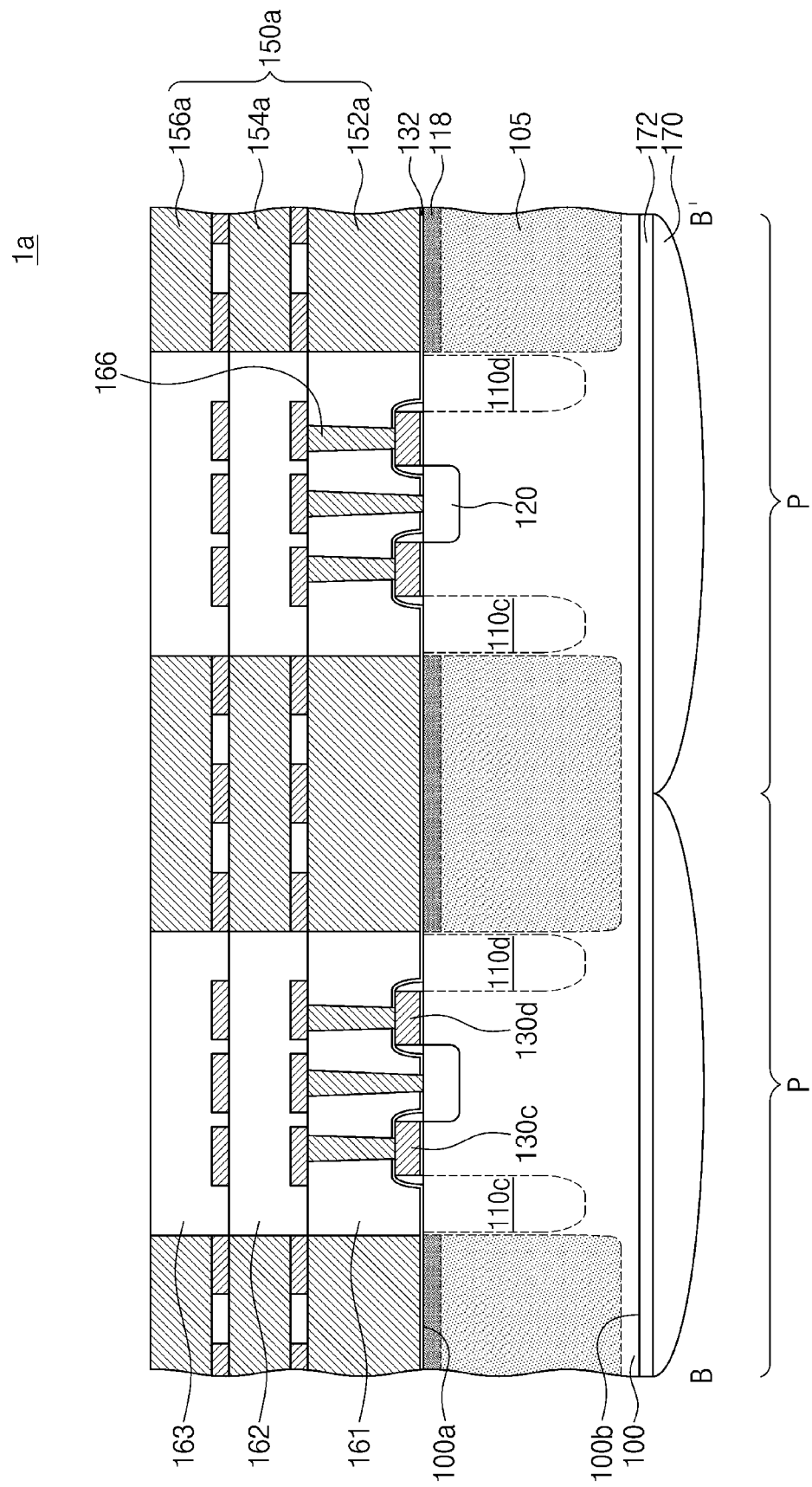
FIG. 6B is a sectional view, which is taken along line B-B' of FIG. 4A to illustrate an image sensor according to an exemplary embodiment of the present inventive concept.

FIGS. 6A and 6B are sectional views illustrating an image sensor 1a according to an exemplary embodiment of the present inventive concept. For example, FIG. 6A is a sectional view taken along line A-A' of FIG. 4A, and FIG. 6B is a sectional view taken along line B-B' of FIG. 4A. In the following description, an element previously described with reference to FIGS. 5A and 5B may be identified by the same reference number without repeating an overlapping description thereof, for the sake of brevity.

A grid pattern 150a of the image sensor 1a may be provided in the interlayered insulating layer 161 and the inter-wire insulating layers 162 and 163. The grid pattern 150a may include a first grid pattern 152a and second grid patterns 154a and 156a. The first grid pattern 152a may be formed to penetrate the interlayered insulating layer 161. Each of the second grid patterns 154a and 156a may be formed to be in direct contact with at least one of the wires 165. Here, a ground voltage may be applied to some of the wires 165-1 and 165-2, which are directly connected to the first and second grid patterns 152a, 154a, and 156a.

The ion injection region 118 may be formed in a portion of the semiconductor substrate 100 adjacent to the first grid pattern 152a. For example, the ion injection region 118 may be formed in a portion of the doped isolation layer 105 that is adjacent to the first surface 100a of the semiconductor substrate 100. In an exemplary embodiment, the ion injection region 118 may include at least one portion extending toward or into the first to fourth photoelectric conversion devices 110a-110d. The ion injection region 118 may be formed by implanting impurities of a same conductivity as impurities doped into the semiconductor substrate 100. A concentration of the impurities doped into the ion injection region 118 may be higher than a concentration of the impurities doped into the semiconductor substrate 100. In order to form the first grid pattern 152a, the interlayered insulating layer 161 should be etched in advance. In the etching process, the surface portion of the semiconductor substrate 100 may be damaged by plasma generated during the etching process of etching the interlayered insulating layer 161. Forming the ion injection region 118 by implanting impurities of high concentration and same conductivity may cure the damage of the surface portion of the semiconductor substrate 100.

Figure 7:
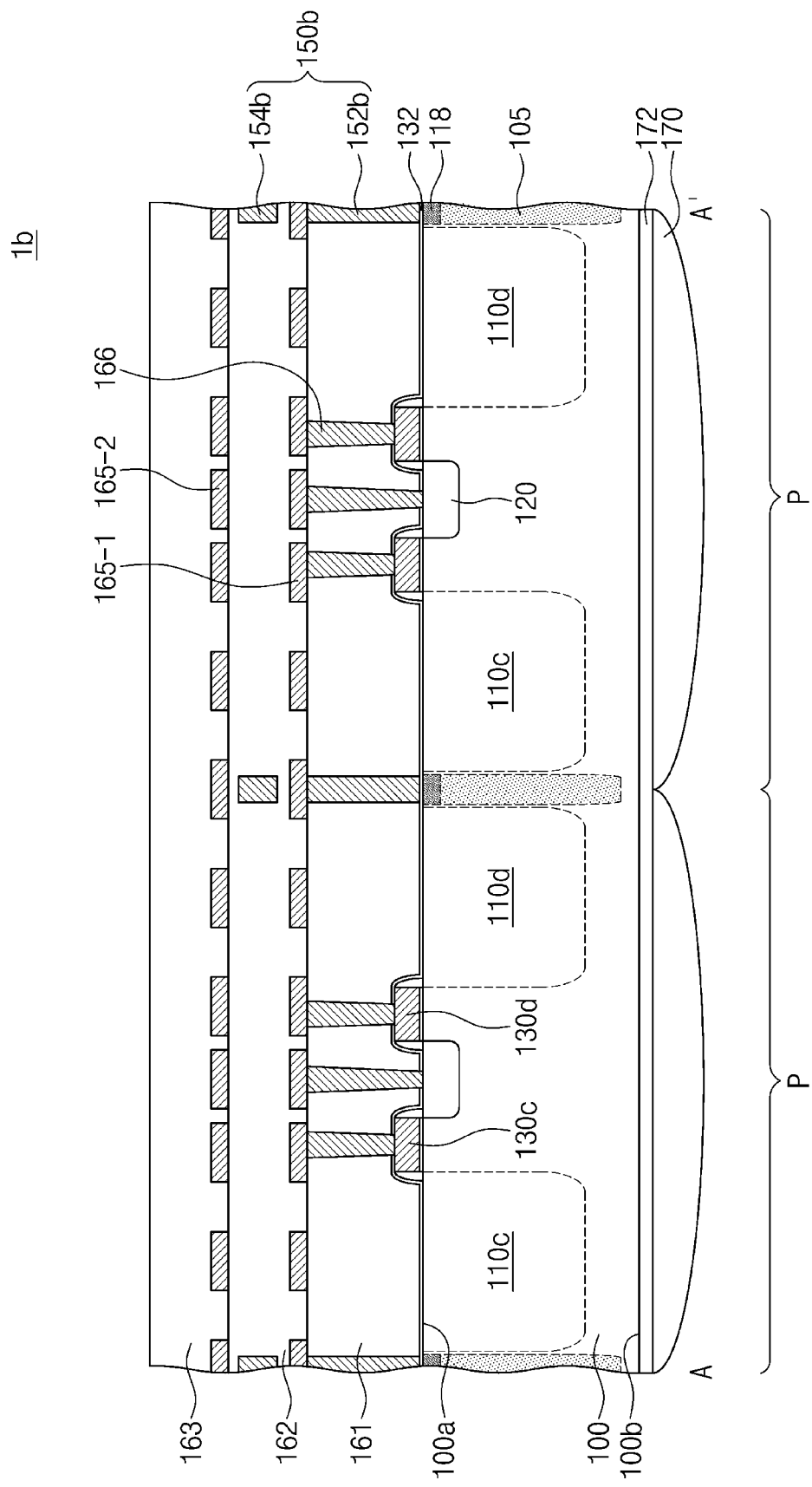
FIG. 7 is a sectional view, which is taken along line A-A' of FIG. 4A to illustrate an image sensor according to an exemplary embodiment of the present inventive concept.

FIG. 7 is a sectional view, which is taken along line A-A' of FIG. 4A to illustrate an image sensor 1b according to an exemplary embodiment of the inventive concept. In the following description, an element previously described with reference to FIGS. 5A to 6B may be identified by the same reference number without repeating an overlapping description thereof, for the sake of brevity.

A grid pattern 150b of the image sensor 1b may include a first grid pattern 152b, which is provided in the interlayered insulating layer 161, and a second grid pattern 154b, which is provided in the first inter-wire insulating layer 162. The first grid pattern 152b may be provided to penetrate the interlayered insulating layer 161, and the second grid pattern 154b may be provided in the first inter-wire insulating layer 162. The second grid pattern 154b may be provided in such a way that top and bottom surfaces thereof are respectively spaced apart from the top and bottom surfaces of the first inter-wire insulating layer 162. In an exemplary embodiment, a bottom surface of the second grid pattern 154b may be higher than a top surface of each of the plurality of first wires 165-1. There may be no grid pattern in the second inter-wire insulating layer 163, but the present inventive concept is not limited thereto. The inventive concept is not limited by the presence/absence or arrangement of grid pattern provided in each of the interlayered and inter-wire insulating layers 161, 162, and 163.

Figure 8:
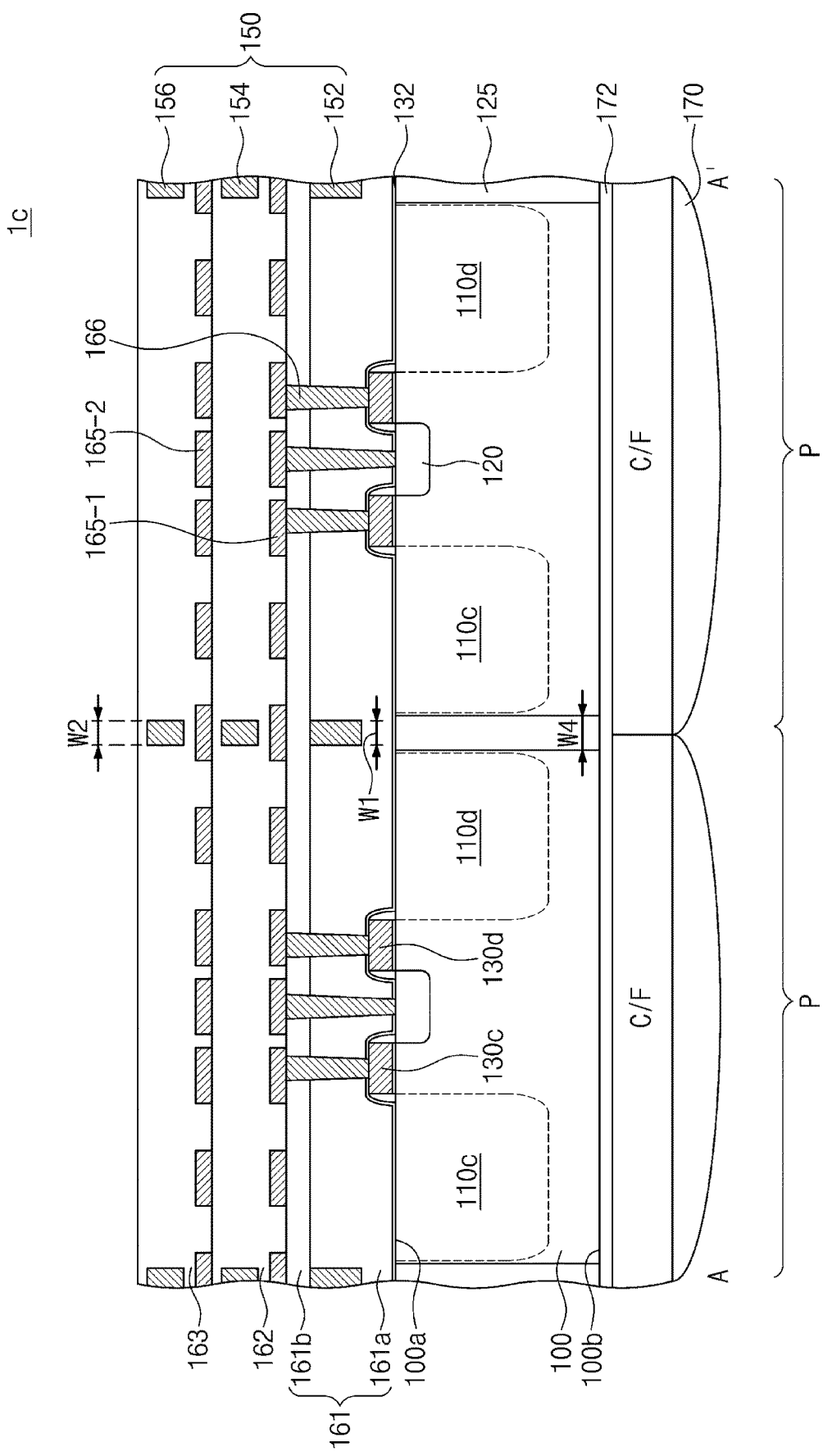
FIG. 8 is a sectional view, which is taken along line A-A' of FIG. 4A to illustrate an image sensor according to an exemplary embodiment of the present inventive concept.

FIG. 8 is a sectional view, which is taken along line A-A' of FIG. 4A to illustrate an image sensor 1c according to an exemplary embodiment of the present inventive concept. In the following description, an element previously described with reference to FIGS. 5A and 5B may be identified by the same reference number without repeating an overlapping description thereof, for the sake of brevity.

The image sensor 1c may include a device isolation layer 125, which is provided in the semiconductor substrate 100 to define the unit pixel regions P. The device isolation layer 125 may be provided to vertically penetrate the semiconductor substrate 100 from the first surface 100a to the second surface 100b. A vertical thickness of the device isolation layer 125 may be substantially equal to a vertical thickness of the semiconductor substrate 100. When viewed in a plan view, the device isolation layer 125 may have a lattice or grid shape. The device isolation layer 125 may be a deep device isolation layer that is formed in the semiconductor substrate 100 by a deep trench isolation (DTI) process. The device isolation layer 125 may be formed of an insulating material, whose a refractive index is lower than a refractive index of the semiconductor substrate 100 (e.g., of silicon). For example, the device isolation layer 125 may be formed of or include silicon oxide.

The widths W1 and W2 of the grid pattern 150 may be smaller than a width W4 of the device isolation layer 125. The width W4 of the device isolation layer 125 may be substantially equal to the minimum width of the device isolation layer 125. This may make it possible to reduce an area of an optical dead zone, which is caused by the grid pattern 150 and the semiconductor substrate 100 overlapping. The width W4 of the device isolation layer 125 may be substantially uniform, as shown in FIG. 8, but the present inventive concept is not limited thereto. For example, the width of the device isolation layer 125 may decrease in a direction from the first surface 100a toward the second surface 100b. Although not shown, the device isolation layer 125 may include at least one of liner or insulating layers.

Color filters C/F may be provided on the second surface 100b of the semiconductor substrate 100. The color filters C/F each may be provided between the anti-reflection layer 172 and one of the micro lenses 170. The color filters C/F may be provided to face the unit pixel regions P, respectively. The color filters C/F may include red, green, and blue color filters. For example, each unit pixel may include at least one red, green and blue color example.

According to an exemplary embodiment of the inventive concept, it may be possible to increase an amount of light to be incident into a unit pixel region and to suppress a cross talk. This may make it possible to increase sensitivity and signal-to-noise ratio (SNR) characteristics of an image sensor. In particular, it may be possible to suppress the cross-talk phenomenon, which results from long-wavelength light (e.g., infrared light of about 700 nm or longer) exhibiting a relatively long penetration property.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An image sensor comprising:
a substrate having a first surface and a second surface facing each other;
a micro-lens on the first surface;
a first photoelectric conversion region in the substrate, the first photoelectric conversion region having a first side, a second side, a third side, and a fourth side which are disposed in a clockwise direction;
an isolation layer disposed at the first side, the second side, the third side, and the fourth side of the first photoelectric conversion region;
a first layer on the second surface; and
a first reflector in the first layer and overlapping the isolation layer disposed at the first side, the second side, the third side, and the fourth side of the first photoelectric conversion region,
wherein the first reflector has a top surface coplanar with a top surface of the first layer and the top surface of the first reflector is spaced apart from the second surface.

2. The image sensor of claim 1, further comprising a second layer on the first layer and a second reflector, and
wherein the second reflector is disposed in the second layer and overlaps the first reflector over the first side and the second side of the first photoelectric conversion region.

3. The image sensor of claim 1, wherein the first layer has a top surface and a bottom surface, and
wherein the first reflector connects the top surface and the bottom surface of the first layer.

4. The image sensor of claim 1, wherein the substrate and isolation layer are doped with a same type of impurities, and
wherein a concentration of impurities is higher in the isolation layer than the substrate.

5. The image sensor of claim 1, wherein the substrate has a first refractive index and the isolation layer has a second refractive index different from the first refractive index.

6. The image sensor of claim 1, further comprising a second photoelectric conversion region in the substrate, and
wherein the isolation layer is disposed between the first photoelectric conversion region and the second photoelectric conversion region.

7. The image sensor of claim 6, wherein the first reflector is disposed over a region between the first photoelectric conversion region and the second photoelectric conversion region.

8. An image sensor comprising:
a substrate having a first surface and a second surface facing each other;
a micro-lens on the first surface;
a first photoelectric conversion region in the substrate, the first photoelectric conversion region having a first photoelectric conversion device and a second photoelectric conversion device;
a first layer on the second surface; and
a first reflector disposed between the first photoelectric conversion device and the second photoelectric conversion device, and
wherein the first photoelectric conversion device and the second photoelectric conversion device are disposed under the micro-lens, and
wherein the first reflector is disposed in the first layer.

9. The image sensor of claim 8, further comprising a second photoelectric conversion region and an isolation layer, and
wherein the isolation layer is disposed between the first photoelectric conversion region and the second photoelectric conversion region, and
wherein the isolation layer is disposed in the substrate.

10. The image sensor of claim 8, wherein the first layer has a top surface and a bottom surface, and
wherein the first reflector connects the top surface and the bottom surface of the first layer.

11. The image sensor of claim 8, further comprising a floating diffusion region between the first photoelectric conversion device and the second photoelectric conversion device.

12. The image sensor of claim 8, wherein the first photoelectric conversion region has a left side and a right side, and
wherein the first reflector is disposed over the left side and the right side of the first photoelectric conversion region.

13. The image sensor of claim 12, further comprising a second layer on the first layer and a second reflector, and wherein the second reflector is disposed in the second layer and overlaps the first reflector over the left side and the right side of the first photoelectric conversion region.

14. The image sensor of claim 12, wherein the first photoelectric conversion region further comprise a third photoelectric conversion device and a fourth photoelectric conversion device, and wherein the first to fourth photoelectric conversion devices are disposed under the micro-lens.

15. The image sensor of claim 14, wherein the first to fourth photoelectric conversion devices are disposed in a clockwise direction, the image sensor further comprising a floating diffusion region disposed at a center among the first to fourth photoelectric conversion devices.

16. An image sensor comprising:
a substrate having a first surface and a second surface facing each other;
four micro-lenses disposed in a clockwise direction on the first surface;
first to fourth photoelectric conversion regions disposed in a clockwise direction in the substrate, the photoelectric conversion regions overlapping the micro-lenses, respectively;
an isolation layer among the first to fourth photoelectric conversion regions in the substrate a first layer on the second surface; and
a first reflector in the first layer and overlapping the isolation layer among the first to fourth photoelectric conversion regions.

17. The image sensor of claim 16,
wherein the first reflector is provided to penetrate a first layer,
the image sensor further comprising an ion injection region provided in the substrate and adjacent to the first reflector.

18. The image sensor of claim 16, wherein the first photoelectric conversion region includes first to fourth photoelectric conversion devices disposed in a clockwise direction in the substrate, the image sensor further comprising a floating diffusion region disposed at a center among the first to fourth photoelectric conversion devices.

19. The image sensor of claim 16, wherein the first reflector has a width smaller than a width of the isolation layer.

20. The image sensor of claim 16, further comprising:
a transfer gate electrode provided in the first layer and on the second surface of the substrate,
wherein, when measured vertically from the second surface, a bottom surface of the first reflector is higher than a top surface of the transfer gate electrode.

* * * * *